(12) United States Patent
Gan et al.

(10) Patent No.: US 9,698,059 B2
(45) Date of Patent: Jul. 4, 2017

(54) SEMICONDUCTOR DEVICE AND METHOD OF FORMING THE SAME

(71) Applicant: UNITED MICROELECTRONICS CORP., Hsin-Chu (TW)

(72) Inventors: Tian Choy Gan, Tainan (TW); Chu-Yun Hsiao, Tainan (TW); Chia-Fu Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/686,787

(22) Filed: Apr. 15, 2015

(65) Prior Publication Data

US 2016/0276224 A1 Sep. 22, 2016

(30) Foreign Application Priority Data

Mar. 19, 2015 (CN) .......................... 2015 1 0121055

(51) Int. Cl.
*H01L 21/8238* (2006.01)
*H01L 29/66* (2006.01)
*H01L 21/265* (2006.01)
*H01L 27/092* (2006.01)

(52) U.S. Cl.
CPC ........... *H01L 21/823842* (2013.01); *H01L 21/26513* (2013.01); *H01L 21/82385* (2013.01); *H01L 21/823821* (2013.01); *H01L 27/0922* (2013.01); *H01L 27/0924* (2013.01); *H01L 29/66537* (2013.01); *H01L 29/66545* (2013.01)

(58) Field of Classification Search
USPC ................................. 257/369; 438/217, 275
See application file for complete search history.

(56) References Cited

U.S. PATENT DOCUMENTS

| 6,137,142 A * | 10/2000 | Burr ................... H01L 21/761 257/349 |
| 6,410,394 B1 | 6/2002 | Shao et al. |
| 6,633,066 B1 * | 10/2003 | Bae ................. H01L 21/76254 257/347 |
| 7,262,104 B1 | 8/2007 | Wang et al. |
| 2004/0106249 A1 * | 6/2004 | Huotari ............. H01L 21/28088 438/216 |
| 2012/0129301 A1 * | 5/2012 | Or-Bach .................. G11C 8/16 438/129 |
| 2012/0292684 A1 * | 11/2012 | Dong ................ H01L 21/28273 257/316 |
| 2015/0001634 A1 * | 1/2015 | Ciavatti .............. H01L 27/0623 257/378 |
| 2015/0214112 A1 * | 7/2015 | Zhao ................... H01L 29/4966 257/369 |

* cited by examiner

Primary Examiner — Zandra Smith
Assistant Examiner — Lawrence Tynes, Jr.
(74) Attorney, Agent, or Firm — Winston Hsu

(57) ABSTRACT

The present invention provides a semiconductor device and a method of forming the same. The semiconductor device includes a substrate, a first transistor and a second transistor. The first transistor and the second transistor are disposed on the substrate. The first transistor includes a first channel and a first work function layer. The second transistor includes a second channel and a second work function layer, where the first channel and the second channel include different dopants, and the second work function layer and the first work function layer have a same conductive type and different thicknesses.

13 Claims, 5 Drawing Sheets

SEMICONDUCTOR DEVICE AND METHOD OF FORMING THE SAME

BACKGROUND OF THE INVENTION

1. Field of the Invention

The invention relates to a semiconductor process of forming a metal gate structure with different threshold voltages and a semiconductor device thereof, and more specifically to a semiconductor process of forming a metal gate structure with different threshold voltages by applying stacked work function layers and performing different threshold voltage implantation processes, and a semiconductor device thereof.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-k gate dielectric layer are used to replace the conventional poly-silicon gate to be the control electrode.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (finFET) has been developed to replace planar MOS transistors. Nevertheless, threshold voltages in current finFETs cannot be easily adjusted by using ion implantation. Hence, how to resolve this issue in today's finFET architecture has become an important task in this field.

SUMMARY OF THE INVENTION

It is one of the primary objectives of the present invention to provide a method of forming a semiconductor device, in which metal gate structures with different threshold voltages are formed by applying stacked work function layers and performing different threshold voltage implantation processes.

It is another one of the primary objectives of the present invention to provide a semiconductor device, which includes gate channels having different doped materials or different doped dosages, and metal gate structures having stacked work function layers with different materials or different thicknesses, so as to achieve preferred device performance.

To achieve the purpose described above, the present invention provides a method of forming a semiconductor device including following steps. First of all, a substrate is provided. Next, a dielectric layer is formed on the substrate, wherein the dielectric layer includes a first gate trench and a second gate trench formed therein. Then, a first threshold voltage implantation process is performed in the first gate trench. After that, a first work function layer is performed in the first gate trench. Finally, a second work function layer is formed in the second gate trench, and on the first work function layer formed in the first gate trench, wherein the first work function layer and the second work function layer have a same conductive type.

To achieve the purpose described above, the present invention provides another method of forming a semiconductor device including following steps. First of all, a substrate is provided. Next, a first threshold voltage implant process is performed on the entire substrate. Then, a first dummy gate structure and a second dummy gate structure are formed on the substrate, wherein each of the first dummy gate structure and the second dummy gate structure includes an interfacial layer and a dummy gate electrode. After that, the dummy gate electrode of the first dummy gate structure is removed to form a first gate trench. Finally, a second threshold voltage implantation process is performed in the first gate trench.

To achieve the purpose described above, the present invention provides a semiconductor device including a substrate, a first gate structure and a second gate structure. The first gate structure is disposed on the substrate. The first gate structure includes a first channel and a first work function layer. The second gate structure is disposed on the substrate. The second gate structure includes a second channel, including different dopants from that of the first channel and a second work function layer, wherein the second work function layer and the first work function layer have a same conductive type and different thicknesses.

The semiconductor device and the forming method thereof in the present invention utilizes forming stacked work function layers with different work functions (for example, work function layers having different materials, different thicknesses or different bondings) and performing different threshold voltage implantation processes, to adjust the threshold voltage of each transistor region. Through such performances, the gate structures formed subsequently in each transistor region may be able to achieve different threshold voltages, thereby improving the substrate effect and forming metal gate structures with different threshold voltages.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
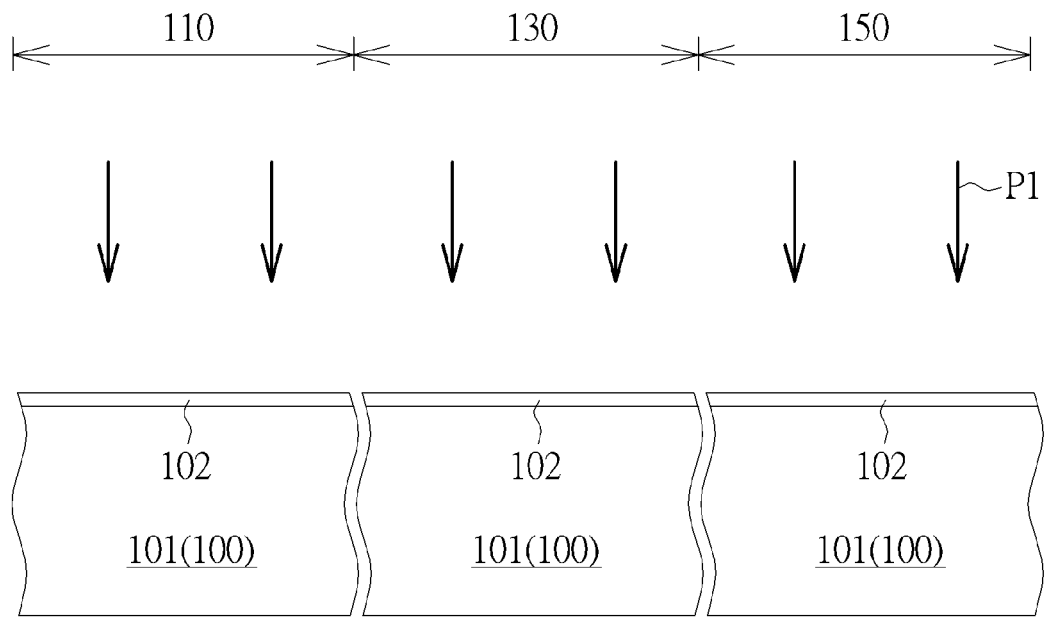
FIG. 1 to FIG. 5 are schematic diagrams illustrating a method of forming a semiconductor device according to a first embodiment of the present invention.

Please refer to FIG. 1 to FIG. 5, which are schematic diagrams illustrating a method of forming a semiconductor device according to the first embodiment of the present invention. First of all, as shown in FIG. 1, a substrate 100 is provided. The substrate 100 for example includes a semiconductor substrate, such as a silicon substrate, a silicon-containing substrate or a silicon-on-insulator (SOI) substrate. Then, three transistor regions 110, 130, 150 are defined on the substrate 100. The three transistor regions 110, 130, 150 are preferably composed of a same conductive type, such as PMOS regions or NMOS regions, and the three transistor regions 110, 130, 150 are configured to fabricate gate structures having different threshold voltages afterwards. However, in other embodiments of the present invention, the three transistor regions 110, 130, 150 may also be composed of different conductive types. For example, only the transistor regions 110, 130 are composed of PMOS region, and the transistor region 150 is composed of NMOS region.

Also, at least one fin shaped structure 101 and an insulating layer (not shown in the drawings) are formed in the substrate 100, wherein a bottom portion of the fin shaped structure 101 is surrounded by the insulating layer, for example being surrounded by silicon oxide, which may be performed as a shallow trench isolation (STI). In one embodiment, the fin shaped structures 101 may be formed preferably through forming a patterned mask layer (not shown in the drawings) on the substrate 100 and transferring the patterns of the patterned mask layer to the substrate 100. Next, depending on the structural difference of a tri-gate transistor or a dual-gate fin-shaped transistor being fabricated, the patterned mask layer may be partially removed selectively or retained, and deposition, chemical mechanical polishing (CMP), and etching back processes are carried out to form the insulating layer. In this way, a portion of the substrate 101 protruded from the insulating layer may perform as the fin-shaped structure 101.

Alternatively, in another embodiment, the formation of the fin shaped structures 101 may also be accomplished by forming a patterned hard mask layer (not shown in the drawings) on the substrate 100, and then performing an epitaxial process on the exposed substrate 100 through the patterned hard mask layer to form a semiconductor layer (not shown in the drawings), such as silicon or silicon germanium layer. The semiconductor layer may then be used as the corresponding fin-shaped structure. Otherwise, in another embodiment, if the substrate is a SOI substrate (not shown in the drawing), the formation of the insulating layer may be omitted, and the patterned mask layer may be used to etch a semiconductor layer (not shown in the drawing) on the substrate until reaching a bottom oxide layer (not shown in the drawing) underneath, to form the corresponding fin-shaped structures.

Then, a metal gate process may be performed to form three metal gate structures on the substrate 100. In the present embodiment, the formation of the metal gate structures are exemplified through a "gate-last" process and a "high-k last" process. It is noted that, as shown in FIG. 1, a threshold voltage implantation process P1 is performed on the entire fin shaped structure 101 of the substrate 100 before the metal gate process, so that a dopant with a different conductive type may be implanted into the entire surfaces of the fin shaped structure 101, to form a doped region 102. For example, if PMOS transistors are formed selectively in the three transistor regions 110, 130, 150, an N-type dopant may be implanted into the fin shaped structure 101 to primary adjust the threshold voltage (Vth) of the gate structures formed subsequently in the three transistor regions 110, 130 150. In contrast, if NMOS transistors are formed selectively in the three transistor regions 110, 130, 150, a P-type dopant may be implanted into the fin shaped structure 101 to adjust the threshold voltage (Vth) of the gate structures formed subsequently in the three transistor regions 110, 130 150. In one embodiment, the N-type dopant may include arsenic (As), phosphorus (P), antimony (Sb) or bismuth (Bi); and the P-type dopant may include boron (B), aluminum (Al), gallium (Ga) or indium (In). Furthermore, in another embodiment, a buffer layer (not shown in the drawings) may be formed additionally on the fin shaped structure 101 of the substrate 100 before the threshold voltage implantation process P1 is performed, and the buffer layer may be selectively removed or retained according to the requirements of the following processes.

Figure 2:
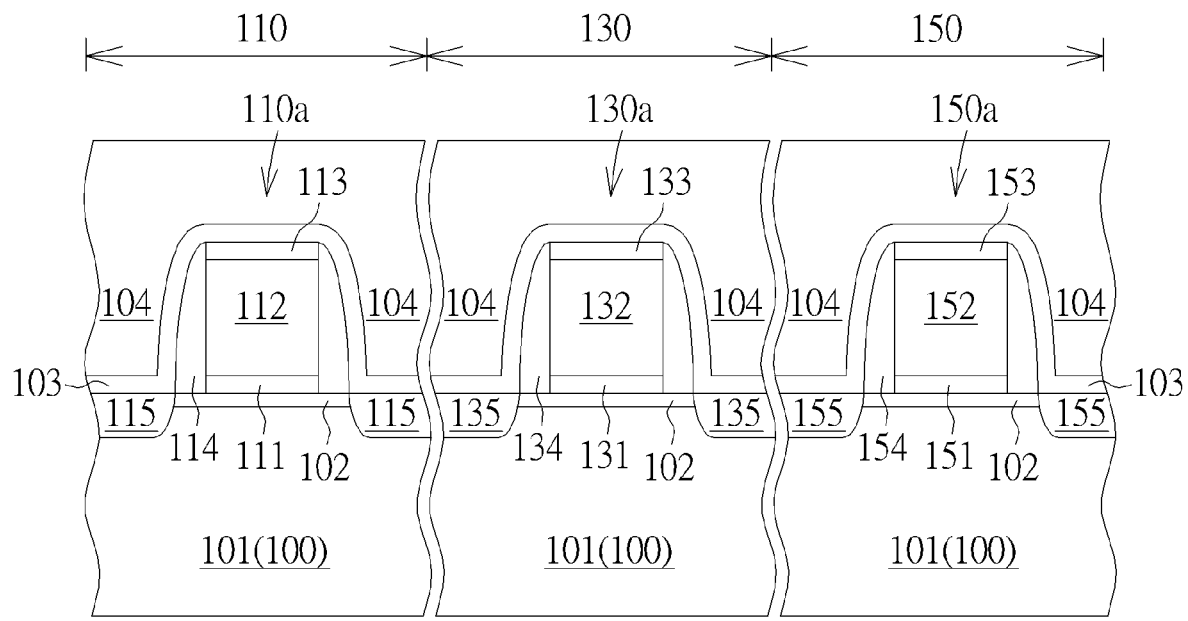

In the following, an interfacial material layer (not shown in the drawings) a sacrificial gate material layer (not shown in the drawings) and a capping material layer (not shown in the drawings) are sequentially formed from bottom to top and disposed across the fin shaped structure 101, and those stacked layers are then patterned, thereby forming three dummy gate structures 110a, 130a, 150a as shown in FIG. 2. Precisely, the dummy gate structures 110a, 130a, 150a include interfacial layers 111, 131, 151, such as silicon oxide, silicon nitride or silicon oxynitride; dummy gate electrodes 112, 132, 152, such as doped polysilicon material, undoped polysilicon material or amorphous silicon material; and capping layers 113, 133, 153, composed of monolayered or multilayered structures, respectively. Then, monolayered or multilayered spacers 114, 134, 154 are formed respectively on sidewalls of the dummy gate structure 110a, 130a, 150a, with the spacers 114, 134, 154 for example including high temperature oxide (HTO), silicon nitride, silicon oxide, silicon oxynitridd, or silicon nitride formed by hexachlorodisilane ($Si_2Cl_6$) (HCD-SiN), and source/drain regions 115, 135, 155 are formed at two sides of the dummy gate structures 110a, 130a, 150a. Subsequently, a contact etch stop layer (CESL) 103 may be formed to cover the entire dummy gates 110a, 130a, 150a, and an interlayer dielectric layer (ILD) 104, such as a silicon oxide layer or a tetraethyl orthosilicate (TEOS) layer may be formed on the CESL 103.

Figure 3:
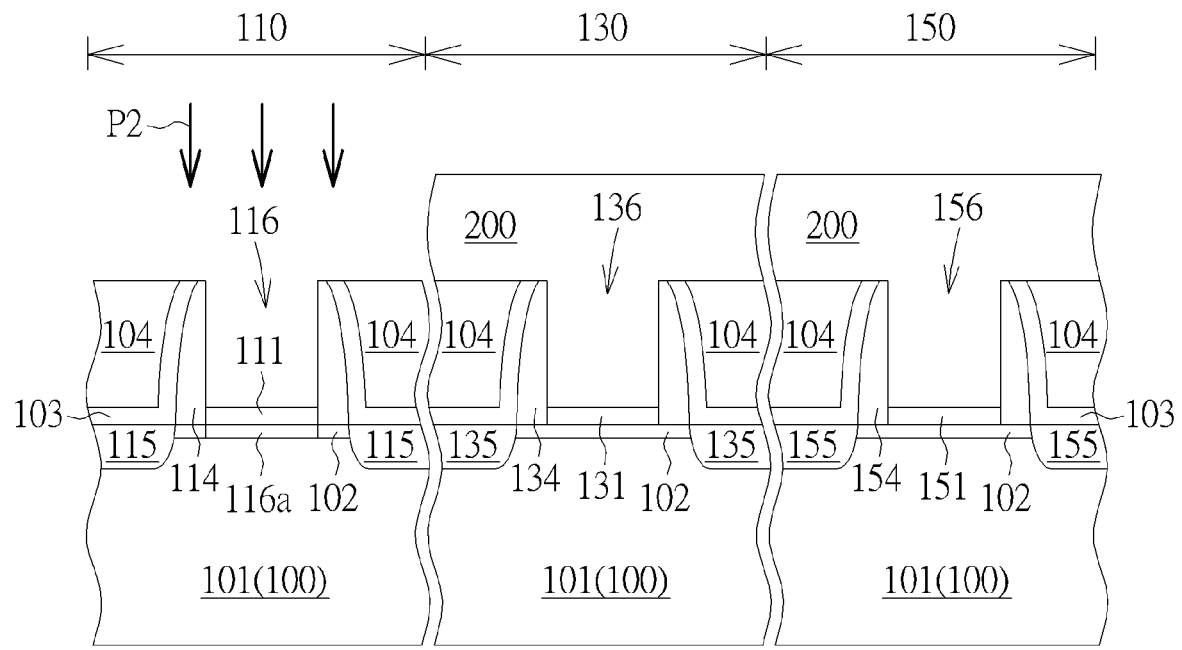

Next, as shown in FIG. 3, the ILD layer 104 and the CESL 103 are planarized to expose top portions of the dummy gate electrodes 112, 132, 152, and a dry etching or a wet etching process is selectively performed to remove the dummy gate electrodes 112, 132, 152 by using an etchant, such as ammonium hydroxide ($NH_4OH$) or tetramethylammonium hydroxide (TMAH), so that, three gate trenches 116, 135, 156 are formed in the ILD layer 104 with the interfacial layers 111, 131, 151 remaining in the three gate trenches 116, 135, 156 respectively.

Following these, a patterned mask layer, such as a patterned photoresist layer 200, is formed to cover the transistor regions 130, 150, and another threshold voltage implantation process P2 is performed at the exposed gate trench 116 (within the transistor region 110) through the patterned photoresist layer 200, to form a doped region 116a, thereby further adjusting the threshold voltage of the gate structures formed subsequently in the transistor region 110. Precisely speaking, the threshold voltage implantation process P2 is preferably performed by using a dopant having the same conductive type and different doped materials from that of the threshold voltage implantation process P1. For example, if antimony atoms (N-type dopant) are implanted in the fin shaped structures 101 in the threshold voltage implantation process P1, bismuth atoms (N-type dopant) may be used in the threshold voltage implantation process P2, such that, the gate structure of the transistor region 110 may obtain a different threshold voltage from that of the transistor regions 130, 150, but is not limited thereto. In another embodiment, the same doped material used in the threshold voltage implantation process P1, such as antimony may also be used in the threshold voltage implantation process P2, but in a different doped dosage, such that, the transistor region 110 may obtain a relatively higher dopant concentration in comparison with the transistor regions 130, 150, so as to achieve different threshold voltages. In contrast, if aluminum atoms (P-type dopant) are used in the threshold voltage implantation process P1, aluminum atoms (P-type dopant) or other P-type dopants may be selectively used in the threshold voltage implantation process P2 then.

Figure 4:
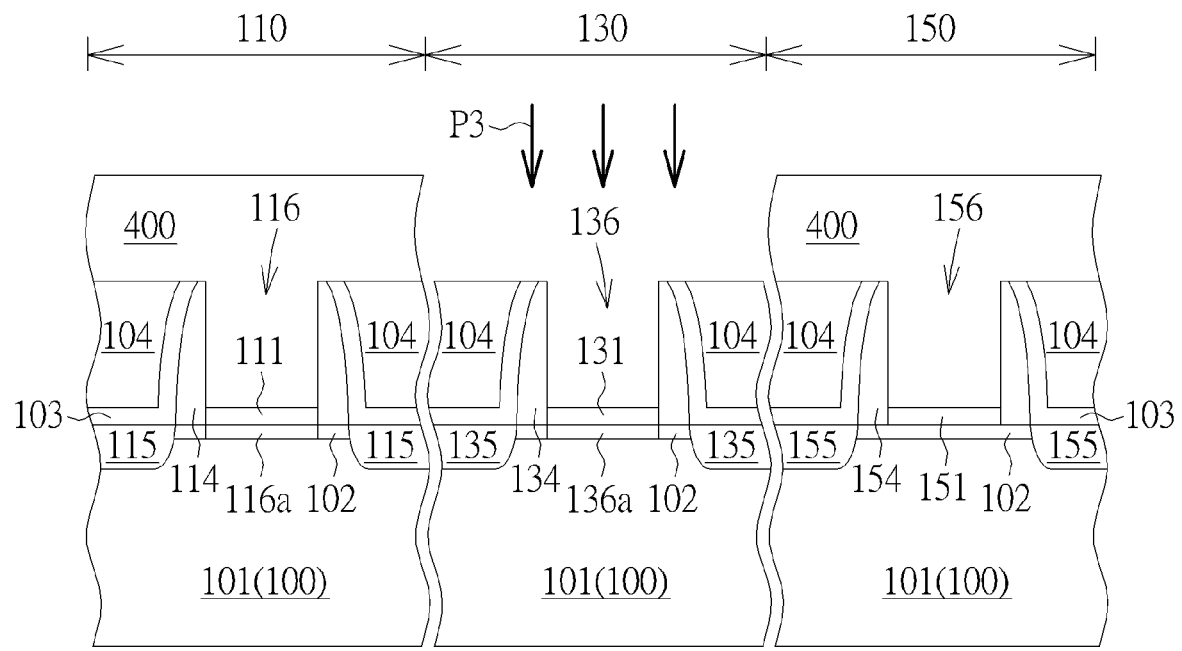

As shown in FIG. 4, the patterned photoresist layer 200 is removed, and another patterned photoresist layer 400 is then formed to cover the transistor regions 110, 150. Through the patterned photoresist layer 400, another threshold voltage implantation process P3 is performed at the exposed gate trench 136 (within the transistor region 130), to form a doped region 136a, thereby further adjusting the threshold voltage of the gate structures formed subsequently in the transistor region 130. In one embodiment, the threshold voltage implantation process P3 may be performed by using a dopant having the same conductive type and different doped materials from that of the threshold voltage implantation process P1. Otherwise, the threshold voltage implantation process P3 may also be performed by using the same doped material as that used in the threshold voltage implantation processes P1, P2, but in different doped dosage from that of the threshold voltage implantation process P2, such that, the three transistor regions 110, 130, 150 may obtain different threshold voltages due to containing different dopant concentrations.

Thus, through the forming method of the present embodiment, the threshold voltage implantation process P1 is performed at the three transistor regions 110, 130, 150 simultaneously, and the threshold voltage implantation process P2 is performed individually at the transistor region 110 and the threshold voltage implantation process P3 is performed individually at the transistor region 130, so that, the three transistor regions 110, 130, 150 may obtain different threshold voltages due to containing different dopant concentration or doped materials. In other words, the different threshold voltage implantation processes P1, P2, P3 are performed through different patterned photoresist layers 200, 400 covering different regions, for adjusting the threshold voltages of the transistor regions 110, 130, 150. Subsequently, the interfacial layers 111, 131, 151 are selectively removed individually or simultaneously, or the interfacial layers 111, 131, 151 may be removed individually or simultaneously at first before the threshold voltage implantation processes P2, P3 are performed.

Also, in another embodiment, after the threshold voltage implantation process P3 is performed, the aforementioned steps may be carried out repeatedly to remove the patterned photoresist layer 400, to form another patterned photoresist layer (not shown in the drawings) covering the transistor regions 110, 130, and to perform another threshold voltage implantation process (not shown in the drawings) through the patterned photoresist layer, thereby forming another doped region (not shown in the drawings) in the transistor region 150. The threshold voltage implantation process may be performed by using a dopant having the same conductive type and containing different doped materials from that of the threshold voltage implantation process P1. Otherwise, the threshold voltage implantation process may also be performed by using a dopant having a different conductive type from that of the threshold voltage implantation process P1, such that, the doped region having a different conductive type may be obtained accordingly. In another embodiment, the threshold voltage implantation process P1 shown in FIG. 1 may be selectively omitted, and the metal gate process and the threshold voltage implantation processes P2, P3 are directly performed on the fin shaped structure 101.

Figure 5:
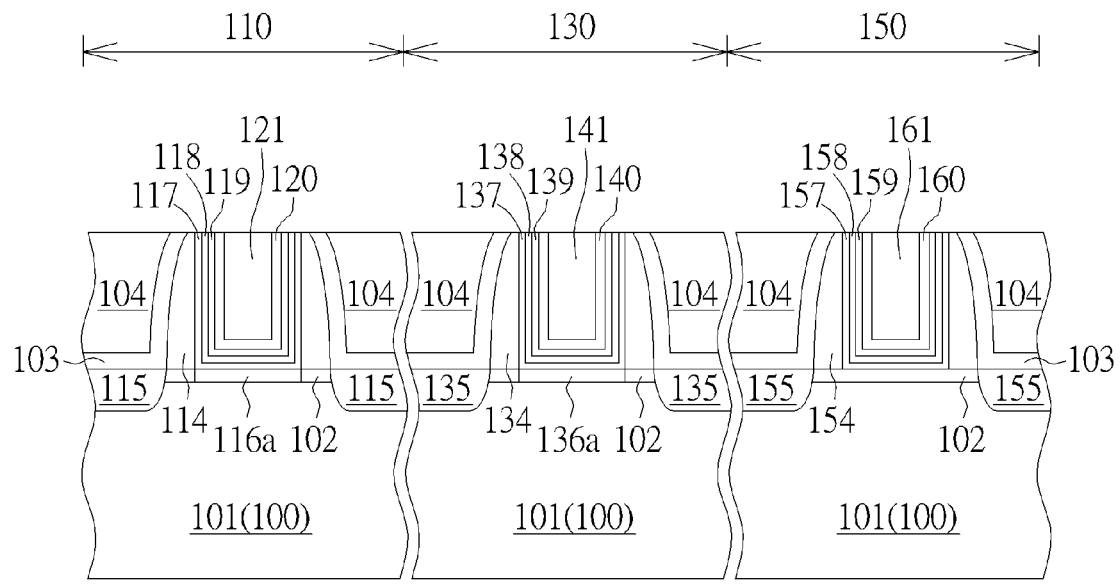

As shown in FIG. 5, U-shaped interfacial layers 117, 137, 157, U-shaped high-k dielectric layers 118, 138, 158, U-shaped bottom barrier metal layers 119, 139, 159 and U-shaped work function layers 120, 140, 160 are formed and stacked sequentially in the gate trenches 116, 136, 156. After that, conductive layers 121, 141, 161 are filled in the gate trenches 116, 136, 156, respectively. The formations of the aforementioned U-shaped interfacial layers 117, 137, 157, the U-shaped high-k dielectric layers 118, 138, 158, the U-shaped bottom barrier metal layers 119, 139, 159, the U-shaped work function layers 120, 140, 160 and the conductive layers 121, 141, 161 may include sequentially forming an interfacial material layer (not shown in the drawings), a bottom barrier metal material layer (not shown in the drawings), a work function material layer (not shown in the drawings) and a conductive material layer (not shown in the drawings), and performing a planarization process, such as a chemical mechanical polishing or an etching process, to remove the interfacial material layer, the bottom barrier metal material layer, the work function material layer and the conductive material layer disposed on the ILD layer 104. However, the formations of the aforementioned stack layers are not limited to the aforementioned process, and in another embodiment, a material layer (not shown in the drawings), such as a tantalum nitride (TiN) layer, may be formed additionally before the work function material layer is formed, to further adjust the work function layer for tuning the work function of the metal gate in the following processes.

In one embodiment, the interfacial layers 117, 137, 157 for example include silicon oxide or silicon nitride. The high-k dielectric layers 118, 138, 158 may include dielectric materials having dielectric constants (k value) larger than 4. For example, the high-k dielectric layers 118, 138, 158 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}$, PZT), barium strontium titanate ($Ba_xSr_{1-x}TiO_3$, BST) or a combination thereof. The bottom barrier metal layers 119, 139, 159 may include a monolayered or multilayered structure, such as including titanium (Ti), tantalum (Ta), titanium nitride (TiN) or tantalum nitride (TaN), but is not limited thereto. Also, compositions of the work function layers 120, 140, 160 may differ from the transistor type adapted in an NMOS or a PMOS transistor. For example, if the transistor is an NMOS transistor, the work function layers 120, 140, 160 may include a metal material having a work function ranging between 3.9 eV and 4.3 eV, such as titanium aluminide (TiAl), zirconium aluminide (ZrAl), tungsten aluminide (WAl), tantalum aluminide (TaAl), hafniumaluminide (HfAl), or titanium aluminum carbide (TiAlC), but is not limited thereto. In contrast, if the transistor is a PMOS transistor, the work function layers 120, 140, 160 may include a metal material having a work function ranging between 4.8 eV and 5.2 eV, such as titanium nitride, tantalum nitride, tantalum carbide (TaC). The conductive layers 121, 141, 161 may include a low resistivity material, such as aluminum (Al), tungsten (W), titanium aluminide or cobalt tungsten phosphide (CoWP), but is not limited thereto.

Through the aforementioned steps, the semiconductor device according to the first embodiment of the present invention can be obtained. In the present embodiment, the gate structures formed in the three transistor regions preferably include the same conductive type, with all of the gate structures being P-type or N-type, for example. Then, different threshold voltage implantation processes are performed through the different patterned photoresist layers covering different regions. In this way, the gate structures formed in the three transistor regions subsequently may obtain different threshold voltages, thereby forming N-type or P-type transistors with a high threshold voltage (HVT), a low threshold voltage (LVT) or a standard threshold voltage (SVT) in the semiconductor device.

However, people who are skilled in the art shall realize the method of forming the semiconductor device in the present invention is not limited to the aforementioned steps, and may also include other processes. For example, in other embodiments, the threshold voltage implantation processes P2, P3 may also be performed selectively through the patterned photoresist layer covering other regions, such as the patterned photoresist layer only covering the transistor region 110 or the transistor region 130, so that, gate structures having different threshold voltages may be formed in each transistor region according to the practical device requirements. Thus, the following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
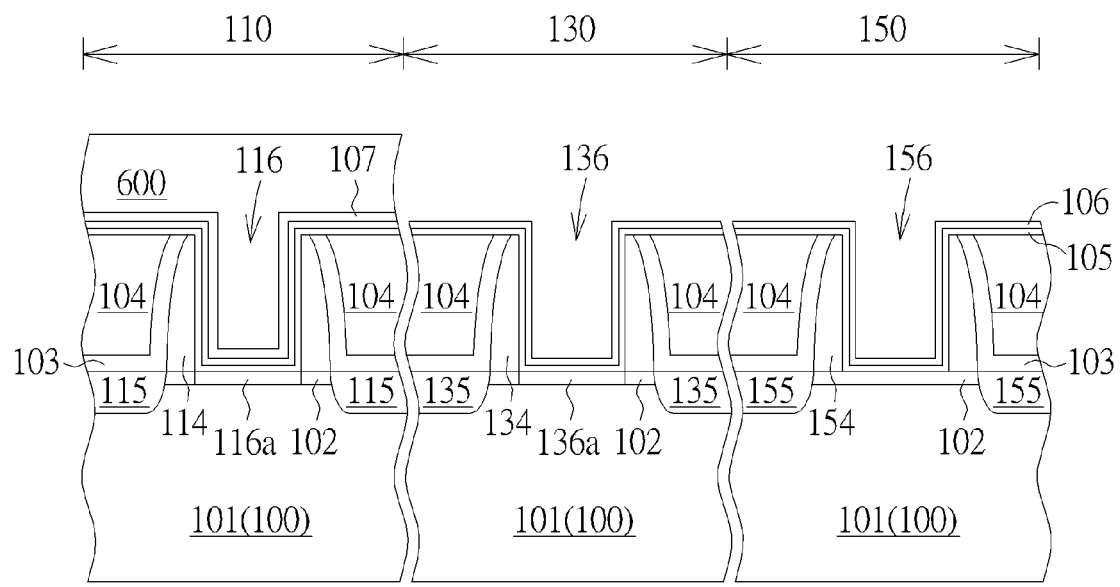
FIG. 6 to FIG. 8 are schematic diagrams illustrating a method of forming a semiconductor device according to a second embodiment of the present invention.
Figure 7:
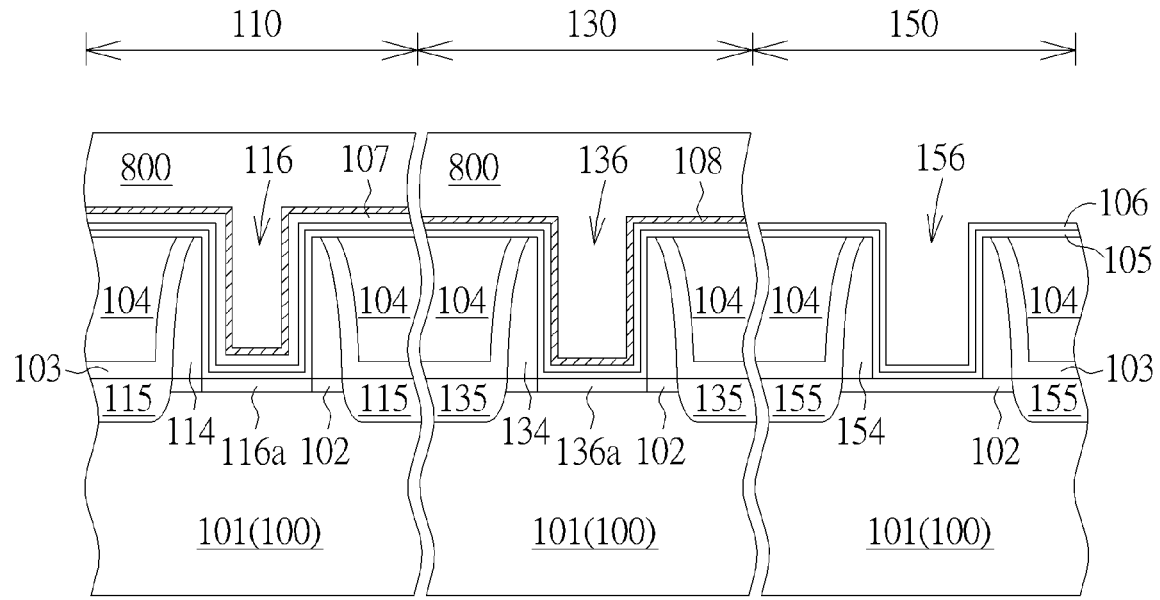
Figure 8:
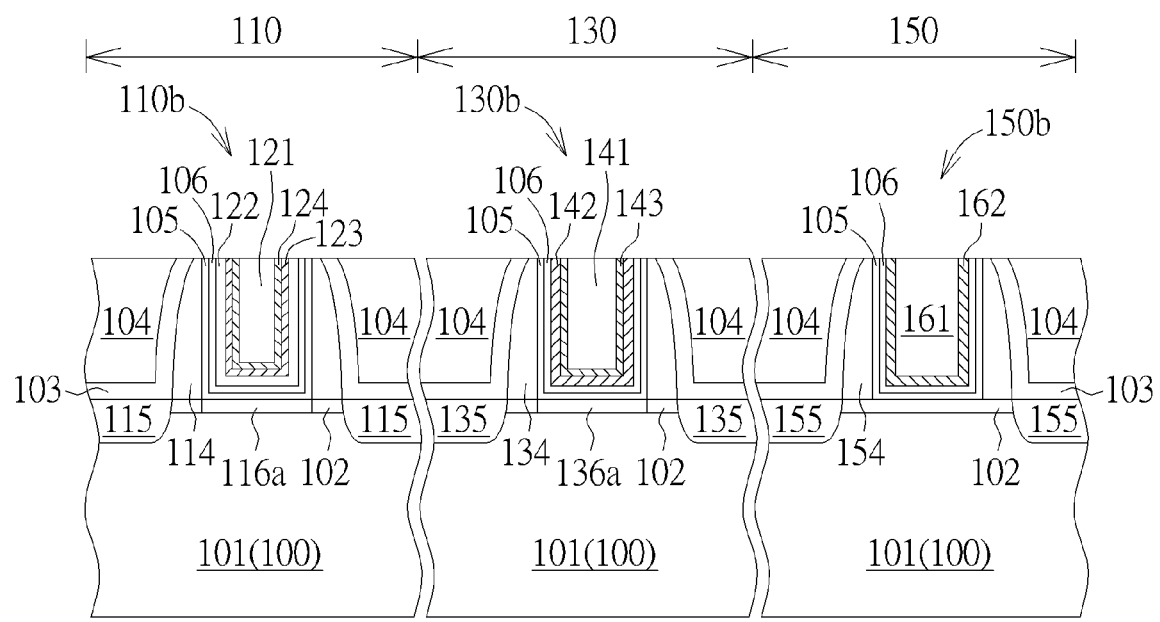

Please refer to FIG. 6 to FIG. 8, which are schematic diagrams illustrating a method of forming a semiconductor device according to a second embodiment of the present invention. The formal steps in the present embodiment are similar to those shown in FIG. 1 to FIG. 4 of the first embodiment, and which includes providing the substrate 100 and forming three transistor regions 110, 130, 150 having the same conductive type, such as P-type, on the substrate 100. Also, through performing threshold voltage implantation processes P1, P2, P3, the doped regions 116a, 136a, 102 having different dopants (such as having different doped dosages or different doped materials) in the transistor regions 110, 130, 150, are formed respectively, so as to obtain different threshold voltages.

In addition, as shown in FIG. 6, the differences between the present embodiment and the aforementioned first embodiment are that, after forming the semiconductor structure shown in FIG. 4, the patterned photoresist layer 400 and the interfacial layers 111, 131, 151 are removed. Then, a high-k dielectric layer 105 and a bottom barrier metal layer 106 are formed sequentially in the transistor regions 110, 130, 150, to cover the fin shaped structure 101 and to fill in the gate trenches 116, 136, 156. The detailed materials of the high-k dielectric layer 105 and the bottom barrier metal layer 106 are all similar to those in the aforementioned first embodiment and will not be further detailed herein.

As follows, a work function layer 107 is selectively formed only in the transistor region 110. The formation of the work function layer 107 for example includes forming a work function material layer (not shown in the drawings) on the fin shaped structure 101 to cover the transistor regions 110, 130, 150, forming a patterned mask, such as a patterned photoresist layer 600, to cover the transistor region 110, and removing the exposed work function material layer formed within the transistor regions 130, 150 by using the patterned photoresist layer 600 as a mask, to only retain the work function material layer formed within the transistor region 110, and to form the work function layer 107 filled in the gate trench 116, within the transistor region 110, as shown in FIG. 6. In one embodiment, the work function layer 107 preferably includes a P-type work function layer, for example being composed of titanium nitride, tantalum nitride, or tantalum carbide (TaC), but is not limited thereto.

Next, as shown in FIG. 7, another work function layer 108 is selectively formed only in the transistor regions 110, 130. The formation of the work function layer 108 for example includes firstly removing the patterned photoresist layer 600, forming another work function material layer (not shown in the drawings) on the fin shaped structure 101 to cover the transistor regions 110, 130, 150, forming another patterned mask, such as a patterned photoresist layer 800, to cover the transistor regions 110, 130 and removing the exposed work function material layer formed within the transistor region 150 by using the patterned photoresist layer 800 as a mask, thereby retaining the work function material layer formed within the transistor regions 110, 130 to form the work function layer 108 filled in the gate trenches 116, 136 in the transistor regions 110, 130, respectively, as shown in FIG. 7. The work function layer 108 is formed on the work function layer 107, in the transistor region 110.

It is worth mentioning that, in one embodiment, the work function layer 108 preferably also includes a P-type work function layer which may have different materials, thicknesses, chemical bondings or aluminum concentrations from that of the work function layer 107, so as to tune work function values in the transistors formed subsequently in the transistor regions 110, 130.

After that, the patterned photoresist layer 800 is removed, and another work function layer (not shown in the drawings) is formed to cover the transistor regions 110, 130, 150 without removing another portion of the work function layer in the three transistor regions. The detailed materials and characteristic of the work function layer are all similar to those of the aforementioned work function layer 108 and will not be further detailed herein. Next, a conductive layer (not shown in the drawings) is formed on the work function layer, and a planarization process is performed to form three gate structures 110b, 130b, 150b as shown in FIG. 8. Precisely, the gate structures 110b formed in the transistor region 110 has three work function layers, including a work function layer 122 formed by the work function layer 107, a work function layer 123 formed by the work function layer 108, and the work function layer 124 formed in the end; the gate structures 130b formed in the transistor region 130 has two work function layers, including a work function layer 142 formed by the work function layer 108, and the work function layer 143 formed in the end; and the gate structures 150b formed in the transistor region 150 only has one work function layer 162 formed in the end.

Through the aforementioned steps, the semiconductor device according to the second embodiment of the present invention can be obtained. Except for the above mentioned differences, other steps of the present embodiment are all similar to those in the aforementioned first embodiment and will not be further detailed herein. The forming method of present embodiment not only utilizes performing the threshold voltage implantation processes P1, P2, P3 as shown in the preferred example shown in FIG. 3 to FIG. 4 to form different doped regions 116a, 136a, 102 in the three transistor regions 110, 130, 150 for adjusting the threshold voltages in the three transistor regions 110, 130, 150, but also utilizes performing a deposition process through different patterned photoresist layer 600, 800 covering different regions, as the preferable example shown in FIG. 6 to FIG. 8, to form different work function layers having different materials, thicknesses, chemical bondings or aluminum concentrations but in the same conductive type in each transistor region. With such arrangement, the threshold voltages of the gate structures formed in the three transistor regions 110, 130, 150 may be further adjusted accordingly.

Figure 9:
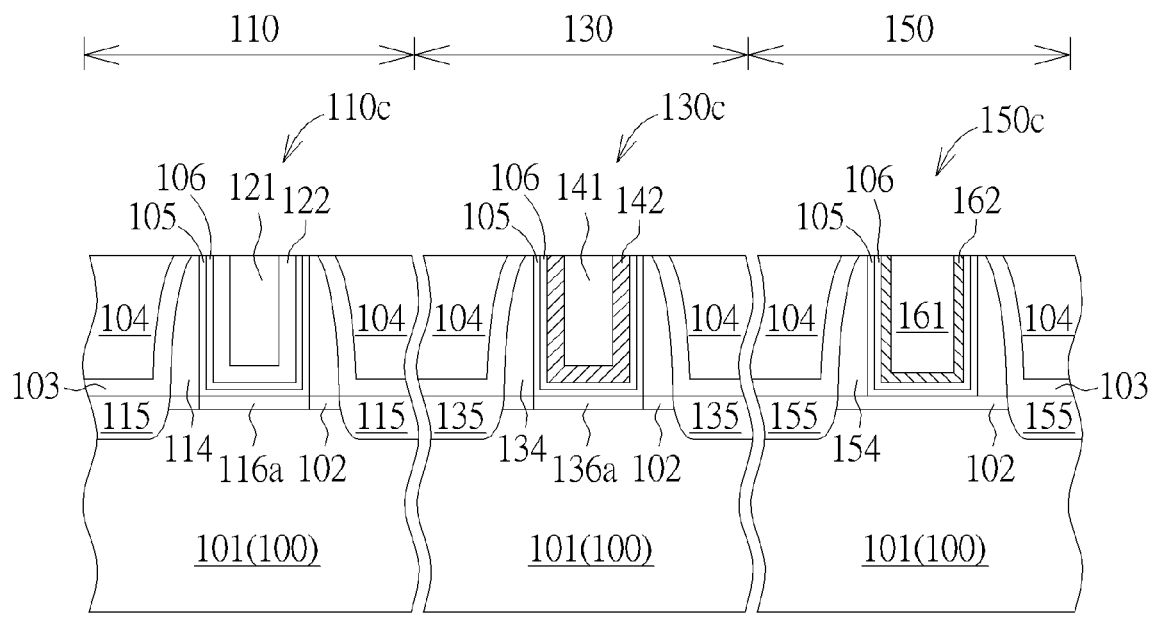
FIG. 9 is a schematic diagram illustrating a method of forming a semiconductor device according to a third embodiment of the present invention.

Please refer to FIG. 9, which is a schematic diagram illustrating a method of forming a semiconductor device according to the third embodiment of the present invention. The forming method of the present embodiment is substantially similar to those in the aforementioned second embodiment, and which includes defining three transistor regions 110, 130, 150 having the same conductive type on the substrate 100. It is noted that, the differences between the present embodiment and the aforementioned second embodiment is in that after removing the patterned photoresist layer 600, different work function layers 142, 162 are formed in the gate trenches 136, 156 in the transistor regions 130, 150 individually, to formed three gate structures 110c, 130c, 150c as shown in FIG. 9. In other words, the work function layers 122, 142, 162 are disposed in the three transistor regions 110, 130, 150 respectively, with each of the work function layers 122, 142, 162 including different materials, thicknesses, chemical bondings or aluminum concentrations, to achieve the purpose of further tuning the work function of the gate structures 110c, 130c, 150c.

Through the aforementioned two embodiments, it is shown that the forming method of the present invention not only utilizes performing the threshold voltage implantation processes P1, P2, P3 as shown in the preferred example shown in FIG. 3 to FIG. 4 to form different doped regions 116a, 136a, 102 in the three transistor regions 110, 130, 150 for primary adjusting the threshold voltages in the three transistor regions 110, 130, 150, but also utilizes performing a deposition process through different patterned photoresist layer 600, 800 covering different regions, as the preferable example shown in FIG. 6 to FIG. 8 or FIG. 9, to form different work function layers having different materials, thicknesses, chemical bondings or aluminum concentrations but in the same conductive type in each transistor region for further tuning the work functions thereof. In other words, through different threshold voltage implantation processes, X number of transistors with the same conductive type and different threshold voltages may be formed in X transistor regions; and through different deposition processes, Y number of transistors with the same conductive type and different threshold voltages (through forming different work function layers having different materials, thicknesses, chemical bondings or aluminum concentrations) may be formed in Y transistor regions. Thus, if the examples of performing the different threshold voltage implantation processes and the different deposition processes are combined with each other, such that, it is sufficient to obtain X×Y variation of threshold voltages, thereby greatly improving the diversity of the integrated fabrication and convenience.

Figure 10:
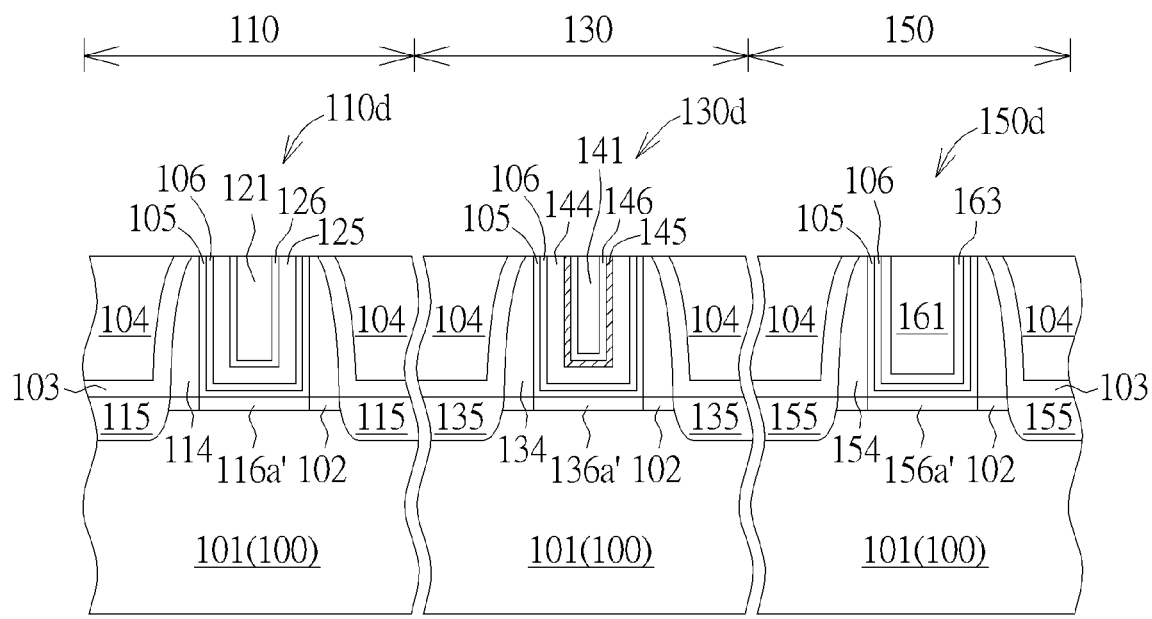
FIG. 10 is a schematic diagram illustrating a semiconductor device according to a preferable embodiment of the present invention.

Please refer to FIG. 10, which is a schematic diagram illustrating a semiconductor device according to a preferable embodiment of the present invention. The semiconductor device of the present embodiment is substantially similar to those shown in the aforementioned second embodiment. However, the differences between the present embodiment and the aforementioned second embodiment is in that the transistor regions 110, 130 have the same conductive type, and the transistor regions 150 has different conductive types form that of the transistor regions 110, 130. For example, if the transistor regions 110, 130 are composed of a PMOS region, respectively, and the transistor region 150 is composed of NMOS region. Precisely speaking, gate structures 110d, 130d, 150d are formed individually in the three transistor regions 110, 130, 150. A channel region 116a' of the gate structure 110d and a channel region 136a' of the gate structures 110d, 130d preferably include P-type dopants having different doped dosages or doped materials, so that, the channel regions 116a', 136a' of the gate structures 110d, 130d may obtain different threshold voltages accordingly. In contrast, a channel region 156a' of the gate structure 150d includes an N-type dopant.

On the other hand, the gate structures 110d, 130d, 150d may be composed of different work function layers. The work function layers may be formed through sequentially forming the high-k dielectric layer 105 and the bottom barrier metal layer 106 in gate trenches 116, 136, 156 in the transistor regions 110, 130, 150, wherein the detailed materials and the forming method of the high-k dielectric layer 105 and the bottom barrier metal layer 106 are all similar to those in the aforementioned first embodiment and will not be further detailed herein. Then, P-type work function layers having different thicknesses, different materials or different chemical bondings are formed in the transistor regions 110, 130. For example, a first P-type work function layer (not shown in the drawings) is firstly formed in the transistor regions 110, 130, 150, a patterned photoresist layer (not shown in the drawings) is next formed to cover the transistor regions 110, 130, and an etching process is performed through the patterned photoresist layer, to remove the first P-type work function layer formed in the transistor region 150 and to retain the first P-type work function layer formed in the transistor regions 110, 130.

In the following, the patterned photoresist layer is removed, and a second P-type work function layer only disposed in the gate trench 136 formed in the transistor region 130 is formed, so as to obtain a relatively thicker P-type work function layer in the transistor region 130, in comparison with the P-type work function formed in the transistor region 110. After these, an N-type work function layer (not shown in the drawings) and a conductive layer (not shown in the drawings) are deposited sequentially in the transistor regions 110, 130, 150, and a planarization process is performed to form the three gate structures 110d, 130d, 150d shown in FIG. 10. Specifically, the gate structure 110d formed in the transistor region 110 includes the P-type work function layer 125 and the N-type work function layer 126; the gate structure 130d formed in the transistor region 130 includes the P-type work function layers 144, 145 and the N-type work function layer 146; and the gate structure 150d formed in the transistor region 150 only includes the N-type work function layer 163 formed in the end.

Please note that, in the present embodiment, the entire thickness of the P-type work function layer 125 formed in the transistor region 110 is relatively less than that of the P-type work function layers (including the P-type work function layer 144 and the P-type work function layer 145) formed in the transistor region 130. Thus, through the aforementioned arrangement, the gate structures 110d, 130d formed in the PMOS transistor region (namely, the transistor regions 110, 130) and the gate structure 150d formed in the NMOS transistor region (namely, the transistor region 150)

may achieve different threshold voltages because of obtaining the different P-type work function layers which have different thickness or N-type work function layer, and the channel regions 116a', 136a', 156a' which have different dopants.

In summary, the semiconductor device and the forming method thereof in the present invention utilizes forming work function layers with different work functions (for example, work function layer having different materials, different thicknesses or different bondings) and performing different threshold voltage implantation processes, to adjust the threshold voltages of each transistor region. Through such performances, the gate structure formed subsequently in each transistor region may be able to achieve different threshold voltages, thereby improving the substrate effect and forming metal gate structures with different threshold voltages.

Additionally, although the aforementioned embodiments are all exemplified as a "gate-last" process and a "high-k last" process, the forming method of the present invention is not limited thereto. Also, in another embodiment, the forming method of the present invention may also be carried out in accordance with a "gate-first" process or a "high-k first" process or through other metal gate forming process, however.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   forming a dielectric layer on the substrate, wherein the dielectric layer comprises a first gate trench, a second gate trench and a third gate trench formed therein;
   performing a first threshold voltage implantation process in the first gate trench;
   performing a third threshold voltage implantation process in the third gate trench;
   after performing the third threshold voltage implantation process, forming a first work function layer in the first gate trench after the first threshold voltage implantation process;
   forming a second work function layer in the second gate trench, and on the first work function layer in the first gate trench, wherein the first work function layer and the second work function layer have a same conductive type; and
   forming a third work function layer in the third gate trench, and on the second work function layer formed in the second gate trench and the first gate trench, wherein the third work function layer has a different conductive type from that of the first work function layer.

2. The method of forming a semiconductor device according to claim 1, further comprising:
   performing a second threshold voltage implantation process in the second gate trench before forming the first work function layer, wherein the second threshold voltage implantation process is performed by implanting different dopants from that of the first threshold voltage implantation process.

3. The method of forming a semiconductor device according to claim 1, further comprising:
   forming a first dummy gate structure and a second dummy gate structure on the substrate, wherein each of the first dummy gate structure and the second dummy gate structure comprises a dummy gate electrode and an interfacial layer;
   removing the dummy gate electrode of the first dummy gate structure to form the first gate trench; and
   removing the dummy gate electrode of the second dummy gate structure to form the second gate trench.

4. The method of forming a semiconductor device according to claim 3, further comprising:
   removing the interfacial layer of the first dummy gate structure before the first threshold voltage implantation process is performed.

5. The method of forming a semiconductor device according to claim 3, further comprising:
   removing the interfacial layer of the first dummy gate structure after the first threshold voltage implantation process is performed.

6. The method of forming a semiconductor device according to claim 3, further comprising:
   forming a fin shaped structure on the substrate, wherein the first dummy gate structure and the second dummy gate structure are formed on the fin shaped structure.

7. The method of forming a semiconductor device according to claim 1, wherein the first work function layer and the second work function layer comprise different materials or have different thicknesses.

8. A method of forming a semiconductor device, comprising:
   providing a substrate;
   performing a first threshold voltage implantation process on the entire substrate;
   forming a first dummy gate structure and a second dummy gate structure on the substrate, wherein each of the first dummy gate structure and the second dummy gate structure has an interfacial layer and a dummy gate electrode;
   removing the dummy gate electrode of the first dummy gate structure to form a first gate trench; and
   performing a second threshold voltage implantation process in the first gate trench right after removing the dummy gate electrode of the first dummy gate structure.

9. The method of forming a semiconductor device according to claim 8, wherein the second threshold voltage implantation process is performed by implanting different dopants from that of the first threshold voltage implantation process.

10. The method of forming a semiconductor device according to claim 8, further comprising:
    removing the dummy gate electrode of the second dummy gate structure to form a second gate trench; and
    performing a third threshold voltage implantation process in the second gate trench right after removing the dummy gate electrode of the second dummy gate structure, wherein the third threshold voltage implantation process is performed by implanting different dopants from that of the first threshold voltage implantation process.

11. The method of forming a semiconductor device according to claim 8, further comprising:
    removing the interfacial layer of the first dummy gate structure before the second threshold voltage implantation process is performed.

12. The method of forming a semiconductor device according to claim 8, further comprising:

removing the interfacial layer of the first dummy gate structure after the second threshold voltage implantation process is performed.

13. The method of forming a semiconductor device according to claim 8, further comprising:
   forming a fin shaped structure on the substrate, wherein the first dummy gate structure and the second dummy gate structure are formed on the fin shaped structure.

\* \* \* \* \*